(12) United States Patent
Lisi et al.

(10) Patent No.: US 8,810,068 B2
(45) Date of Patent: Aug. 19, 2014

(54) SYSTEM AND METHOD FOR OVER-VOLTAGE PROTECTION OF A PHOTOVOLTAIC SYSTEM WITH DISTRIBUTED MAXIMUM POWER POINT TRACKING

(75) Inventors: Gianpaolo Lisi, Campbell, CA (US); Ali Djabbari, Saratoga, CA (US); Gerard Socci, Palo Alto, CA (US); Andrew Ronald Chemistruck, Sunnyvale, CA (US); Rajaram Subramoniam, Cupertino, CA (US); Jianhui Zhang, San Jose, CA (US); Kosha Mahmodieh, Hayward, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 544 days.

(21) Appl. No.: 12/762,148

(22) Filed: Apr. 16, 2010

(65) Prior Publication Data

US 2010/0327659 A1 Dec. 30, 2010

Related U.S. Application Data

(60) Provisional application No. 61/170,582, filed on Apr. 17, 2009.

(51) Int. Cl.
 *H02J 1/00* (2006.01)
(52) U.S. Cl.
 USPC .......................................................... 307/82
(58) Field of Classification Search
 USPC .......................................................... 307/82
 See application file for complete search history.

(56) References Cited

U.S. PATENT DOCUMENTS

| | | |
|---|---|---|
| 3,740,636 A | 6/1973 | Hogrefe et al. |
| 4,129,788 A | 12/1978 | Chavannes |
| 4,189,765 A | 2/1980 | Kotalik et al. |
| 4,280,097 A | 7/1981 | Carey et al. |
| 4,688,538 A | 8/1987 | Ward et al. |
| 4,725,740 A | 2/1988 | Nakata |
| 5,284,719 A | 2/1994 | Landau et al. |

(Continued)

FOREIGN PATENT DOCUMENTS

| | | |
|---|---|---|
| EP | 1 239 573 A1 | 9/2002 |
| ES | 2 249 147 B1 | 5/2007 |

(Continued)

OTHER PUBLICATIONS

Office Action dated Sep. 21, 2011 in connection with U.S. Appl. No. 12/456,777.

(Continued)

*Primary Examiner* — Rexford Barnie
*Assistant Examiner* — Dru Parries
(74) *Attorney, Agent, or Firm* — Andrew Viger; Frederick J. Telecky, Jr.

(57) ABSTRACT

A solar panel array for use in a solar cell power system is provided. The solar panel array includes a string of solar panels and multiple voltage converters. Each voltage converter is coupled to a corresponding solar panel in the string of solar panels. The solar panel array also includes multiple maximum power point tracking (MPPT) controllers. Each MPPT controller is coupled to a corresponding solar panel in the string of solar panels. Each MPPT controller is configured to sense an instantaneous power unbalance between the corresponding solar panel and an inverter.

20 Claims, 4 Drawing Sheets

(56) References Cited

U.S. PATENT DOCUMENTS

| | | | |
|---|---|---|---|
| 5,307,006 A | 4/1994 | Rankin et al. |
| 5,408,404 A | 4/1995 | Mitchell |
| 5,412,308 A | 5/1995 | Brown |
| 5,528,125 A | 6/1996 | Marshall et al. |
| 5,600,247 A | 2/1997 | Matthews |
| 5,604,430 A | 2/1997 | Decker et al. |
| 5,659,465 A | 8/1997 | Flack et al. |
| 5,666,040 A | 9/1997 | Bourbeau |
| 5,669,987 A | 9/1997 | Takehara et al. |
| 5,747,967 A | 5/1998 | Muljadi et al. |
| 5,751,120 A | 5/1998 | Zeitler et al. |
| 5,892,354 A | 4/1999 | Nagao et al. |
| 6,169,678 B1 | 1/2001 | Kondo et al. |
| 6,184,656 B1 | 2/2001 | Karunasiri et al. |
| 6,281,485 B1 | 8/2001 | Siri |
| 6,331,670 B2 | 12/2001 | Takehara et al. |
| 6,369,576 B1 | 4/2002 | Matthews et al. |
| 6,608,404 B2 | 8/2003 | Schienbein et al. |
| 6,633,823 B2 | 10/2003 | Bartone et al. |
| 6,636,431 B2 | 10/2003 | Seki et al. |
| 6,717,519 B2 | 4/2004 | Kobayashi et al. |
| 6,734,652 B1 | 5/2004 | Smith |
| 6,750,391 B2 | 6/2004 | Bower et al. |
| 6,844,739 B2 | 1/2005 | Kasai et al. |
| 6,850,820 B2 | 2/2005 | Tajima |
| 6,966,184 B2 | 11/2005 | Toyomura et al. |
| 6,975,522 B2 | 12/2005 | Asano |
| 6,984,967 B2 | 1/2006 | Notman |
| 7,038,437 B2 | 5/2006 | Kenny et al. |
| 7,046,527 B2 | 5/2006 | West |
| 7,477,080 B1 | 1/2009 | Fest |
| 7,566,828 B2 | 7/2009 | Sasaki |
| 7,605,498 B2 | 10/2009 | Ledenev et al. |
| 7,619,200 B1 | 11/2009 | Seymour et al. |
| 7,701,083 B2 | 4/2010 | Savage |
| 7,723,865 B2 | 5/2010 | Kitanaka |
| 7,759,903 B2 | 7/2010 | Kamata |
| 7,843,085 B2 | 11/2010 | Ledenev et al. |
| 7,925,552 B2 | 4/2011 | Tarbell et al. |
| 7,964,837 B2 | 6/2011 | Seymour et al. |
| 2002/0038667 A1 | 4/2002 | Kondo et al. |
| 2003/0201674 A1 | 10/2003 | Droppo et al. |
| 2004/0135545 A1 | 7/2004 | Fowler et al. |
| 2005/1010522 | 5/2005 | Nishi |
| 2005/0257827 A1 | 11/2005 | Gaudiana et al. |
| 2006/0017327 A1 | 1/2006 | Siri et al. |
| 2006/0149607 A1 | 7/2006 | Sayers et al. |
| 2006/0162772 A1 | 7/2006 | Presher, Jr. et al. |
| 2006/0171182 A1 | 8/2006 | Siri et al. |
| 2006/0176036 A1 | 8/2006 | Flatness et al. |
| 2006/0176040 A1 | 8/2006 | Kernahan et al. |
| 2007/0024257 A1 | 2/2007 | Boldo |
| 2007/0137688 A1 | 6/2007 | Yoshida |
| 2007/0164612 A1 | 7/2007 | Wendt et al. |
| 2008/0013347 A1 | 1/2008 | Deng et al. |
| 2008/0087321 A1 | 4/2008 | Schwartzman |
| 2008/0097655 A1 | 4/2008 | Hadar et al. |
| 2008/0143188 A1 | 6/2008 | Adest et al. |
| 2008/0147335 A1 | 6/2008 | Adest et al. |
| 2008/0150366 A1 | 6/2008 | Adest et al. |
| 2008/0278983 A1 | 11/2008 | Park |
| 2009/0039852 A1 | 2/2009 | Fishelov et al. |
| 2009/0140719 A1 | 6/2009 | Hasenfus |
| 2009/0141522 A1* | 6/2009 | Adest et al. ................. 363/55 |
| 2009/0242011 A1 | 10/2009 | Proisy et al. |
| 2009/0283128 A1 | 11/2009 | Zhang et al. |
| 2009/0283129 A1 | 11/2009 | Foss |
| 2009/0284078 A1 | 11/2009 | Zhang et al. |
| 2009/0284232 A1 | 11/2009 | Zhang et al. |
| 2009/0284240 A1 | 11/2009 | Zhang et al. |
| 2009/0284998 A1 | 11/2009 | Zhang et al. |
| 2009/0289502 A1 | 11/2009 | Batarseh et al. |
| 2010/0001587 A1 | 1/2010 | Casey et al. |
| 2010/0126550 A1 | 5/2010 | Foss |
| 2010/0201339 A1 | 8/2010 | Newman |
| 2010/0269883 A1 | 10/2010 | Sarhan |
| 2010/0288327 A1 | 11/2010 | Lisi et al. |

FOREIGN PATENT DOCUMENTS

| | | |
|---|---|---|
| JP | 07-234733 A | 9/1995 |
| JP | 08-123563 A | 5/1996 |
| JP | 08-314555 A | 11/1996 |
| JP | 10014105 A | 1/1998 |
| JP | 10155240 A | 6/1998 |
| JP | 11098679 A | 4/1999 |
| JP | 2000112545 A | 4/2000 |
| JP | 2000116010 A | 4/2000 |
| JP | 2003134661 A | 5/2003 |
| JP | 2003216255 A | 7/2003 |
| JP | 2005-151662 | 6/2005 |
| JP | 2005243852 A | 9/2005 |
| JP | 2005252172 A | 9/2005 |
| JP | 2006134118 A | 5/2006 |
| JP | 2006216660 A | 8/2006 |
| JP | 2006-320149 | 11/2006 |
| JP | 2007-133765 | 5/2007 |
| KR | 100757320 B1 | 9/2007 |
| KR | 20080010116 A | 1/2008 |
| KR | 100886891 B1 | 3/2009 |
| KR | 1020090133036 A | 12/2009 |
| WO | WO 2007/084196 A2 | 7/2007 |

OTHER PUBLICATIONS

Office Action dated Aug. 30, 2011 in connection with U.S. Appl. No. 12/386,958.
"PV FAQs", U.S. Department on Energy, Jan. 2004, 2 pages.
"Perspectives of Concentrating Solar Power", Renewable Energy India 2008 Expo, Aug. 22, 2008, 16 pages.
"APEC 2008, 23rd Annual Applied Power Electronics Conference and Exposition", vol. 1, Seminars 1-6, Feb. 24-28, 2008, Austin, Texas, 89 pages.
Yunwei Li, et al., "Design, Analysis, and Real-Time Testing of a Controller for Multibus Microgrid System", IEEE Transactions on Power Electronics, vol. 19, No. 5, Sep. 2004, p. 1195-1204.
R.H. Lasseter, "MicroGrids", 2002 IEEE Power Engineering Society Winter Meeting, vol. 1, Jan. 2002, p. 305-308.
John Stevens, "Development of Sources and a Testbed for CERTS Microgrid Testing", 2004 IEEE Power Engineering Society General Meeting, Jun. 2004, p. 1-2.
Mike Barnes, et al., "Real-World MicroGrids—An Overview", 2007 IEEE SoSE International Conference, Apr. 2007, p. 1-8.
Paolo Piagi, et al., "Autonomous Control of Microgrids", IEEE Power Engineering Society General Meeting, Jun. 2006, 8 pages.
Y. Zoka, et al., "An Interaction Problem of Distributed Generators Installed in a MicroGrid", 2004 IEEE International Conference on Electric Utility Deregulation, Restructuring and Power Technologies (DRPT2004), Apr. 2004, Hong Kong, p. 795-799.
M.P.F. Hommelberg, et al., "Distributed Control Concepts using Multi-Agent technology and Automatic Markets: An indispensable feature of smart power grids", 2007 IEEE Power Engineering Society General Meeting, Jun. 2007, p. t-7.
Notification of Transmittal of the International Search Report and the Written Opinion of the International Searching Authority, or the Declaration dated Dec. 17, 2009 in connection with PCT Application No. PCT/US2009/044033.
Guo Heng, et al., "A Novel Maximum Power Point Tracking Strategy for Stand-along Solar Pumping Systems", 2005 IEEE, 5 pages.
Debosmita Das, et al., "An Optimal Design of a Grid Connected Hybrid Wind/Photovoltaic/Fuel Cell System for Distributed Energy Production", 2005 IEEE, p. 2499-2504.
Claus Bjerge, et al., "How to run an offshore wind farm like a conventional power plant", www.modernpowersystems.com, Jan. 2007, 4 pages.
Steven Anderson, "Remote . . . But Not Economically Out of Reach", Power and Energy, Dec. 15, 1986, 5 pages.
Qihi Liu, et al., "Novel Modeling and Control of Doubly-Fed Variable-Speed Constant-Frequency Wind Power Generator", The 33rd

(56) References Cited

OTHER PUBLICATIONS

Annual Conference of the IEEE Industrial Electronics Society (IECON), Nov. 5-8, 2007, p. 1621-1626.
Casisheng Wang, "Modeling and Control of Hybrid Wind/Photovoltaic/Fuel Cell Distributed Generation Systems", Jul. 2006, Montana State University, 403 pages.
Notification of Transmittal of the International Search Report and the Written Opinion of the International Searching Authority, or the Declaration dated Dec. 23, 2009 in connection with International Patent Application No. PCT/US2009/044036.
Jianhui Zhang, et al., "Active Cell and Module Balancing for Batteries or Other Power Supplies", U.S. Appl. No. 12/882,781, filed Sep. 15, 2010.
Ramesh Khanna, "Solar-Powered Battery Charger and Related System and Method", U.S. Appl. No. 12/589,984, filed Oct. 30, 2009.
Andrew Foss, "System and Method for Solar Panel Array Analysis", U.S. Appl. No. 12/386,958, filed Apr. 24, 2009.
Gianpaolo Lisi, et al., "Off-Grid LED Street Lighting System With Multiple Panel-Storage Matching", U.S. Appl. No. 12/925,110, flied Oct. 14, 2010.
Notification of Transmittal of the International Search Report and the Written Opinion of the International Searching Authority, or the Declaration dated Dec. 24, 2009 in connection with International Patent Application No. PCT/US2009/044019.
Carlos Meza, et al., "Boost-Buck inverter variable structure control for grid-connected photovoltaic systems", 2005 IEEE, p. 1318-1321.
Mikihiko Matsui, et al., "A New Maximum Photovoltaic Power Tracking Control Scheme Based on Power Equilibrium at DC Link", 1999 IEEE, p. 804-809.
Notification of Transmittal of the International Search Report and the Written Opinion of the International Searching Authority, or the Declaration dated Dec. 23, 2009 in connection with PCT Application No. PCT/US2009/044027.
Notification of Transmittal of the International Search Report and the Written Opinion of the International Searching Authority, or the Declaration dated Dec. 23, 2009 in connection with PCT Application No. PCT/US2009/044015.

Jianhui Zhang, et al., "Method and System for Providing Central Control in a Energy Generating System", U.S. Appl. No. 12/152,479, filed May 14, 2008.
Stephen W. Moore, et al., "A Review of Cell Equalization Methods for Lithium Ion and Lithium Polymer Battery Systems", Society of Automotive Engineers, Inc., 2001, 5 pages.
Sihua Wen, "Cell balancing buys extra run time and battery life", Analog Applications Journal, 2009, 8 pages.
"Five to Ten Series Cell Lithium-Ion or Lithium-Polymer battery Protector and Analog Front End", Texas Instruments, Jun. 2008, 60 pages.
"Li-Ion, NiMH Battery Measuring, Charge Balancing and Power-supply Circuit", Atmel Corporation, Oct. 2009, 55 pages.
Werner Rößler, "Boost battery performance with active charge-balancing", EE Times—Asia, Jul. 16-31, 2008, p. 1-3.
Notification of Transmittal of the International Search Report and the Written Opinion of the International Searching Authority, or the Declaration dated Dec. 31, 2010 in connection with PCT Application No. PCT/US2010/031462.
Notification of Transmittal of the International Search Report and the Written Opinion of the International Searching Authority, or the Declaration dated Jan. 3, 2011 in connection with PCT Application No. PCT/US2010/031505.
Notification of Transmittal of the International Search Report and the Written Opinion of the International Searching Authority, or the Declaration dated Jan. 13, 2011 in connection with PCT Application No. PCT/US2010/034783.
Office Action dated Dec. 9, 2011 in connection with U.S. Appl. No. 12/454,244.
Office Action dated Dec. 30, 2011 in connection with U.S. Appl. No. 12/456,776.
Office Action dated Jan. 25, 2012 in connection with U.S. Appl. No. 12/454,136.
Office Action dated Nov. 25, 2011 in connection with U.S. Appl. No. 12/272,990.
"Micropower Synchronous, Buck-Boost DC/DC Converter", MiniLogic Device Corporation, Sep. 2005, p. 1-13.
Geoffrey R. Walker, et al., "Cascaded DC-DC Converter Connection of Photovoltaic Modules", IEEE Transactions on Power Electronics, vol. 19, No. 4, Jul. 2004, p. 1130-1139.

* cited by examiner

SYSTEM AND METHOD FOR OVER-VOLTAGE PROTECTION OF A PHOTOVOLTAIC SYSTEM WITH DISTRIBUTED MAXIMUM POWER POINT TRACKING

CROSS-REFERENCE TO RELATED APPLICATIONS AND PRIORITY CLAIM

This application claims priority under 35 U.S.C. §119(e) to U.S. Provisional Patent Application No. 61/170,582 filed on Apr. 17, 2009, which is hereby incorporated by reference.

TECHNICAL FIELD

The present application relates generally to electrical power systems and, more specifically, to a system and method for over-voltage protection in a solar-cell power system.

BACKGROUND

Photovoltaic (PV) panels (here also referred to as "solar panels") use radiant light from the sun to produce electrical energy. The solar panels include a number of PV cells to convert the sunlight into the electrical energy. The majority of solar panels use wafer-based crystalline silicon cells or a thin-film cell based on cadmium telluride or silicon. Crystalline silicon, which is commonly used in the wafer form in PV cells, is derived from silicon, a commonly used semi-conductor. PV cells are semiconductor devices that convert light directly into energy. When light shines on a PV cell, a voltage develops across the cell, and a current flows through the cell when connected to a load. The voltage and current vary with several factors, including the physical size of the cell, the amount of light shining on the cell, the temperature of the cell, and external factors.

A solar panel (also referred to as a "PV module") is made of PV cells arranged in series and in parallel. For example, the PV cells are first coupled in series within a group. Then, a number of the groups are coupled together in parallel. Likewise, a PV array (also referred to as a "solar array") is made of solar panels arranged in series and in parallel.

The electrical power generated by each solar panel is determined by the solar panel's voltage and current. In a solar array, electrical connections are made in series to achieve a desired output string voltage and/or in parallel to provide a desired amount of string current source capability. In some cases, each panel voltage is boosted or bucked with a DC-DC converter.

The solar array is connected to an electrical load, an electrical grid or an electrical power storage device, such as (but not limited to) battery cells. The solar panels deliver direct current (DC) electrical power. When the electrical load, electrical grid or electrical power storage device operates using an alternating current (AC) (for example, sixty cycles per second or 60 Hz), the solar array is connected to the electrical load, electrical grid, or electrical power storage device, through a DC-AC inverter.

Solar panels exhibit voltage and current characteristics described by their I-V curve, an example of which is shown in FIG. 1. When the solar cells are not connected to a load, the voltage across their terminals is their open circuit voltage $V_{oc}$. When the terminals are connected together to form a short circuit, a short circuit current $I_{sc}$ is generated. In both cases, since power is given by voltage multiplied by current, no power is generated. A Maximum Power Point (MPP) defines a point where the solar panels are operating at a maximum power.

Often, a solar panel is capable of large and fast power transients. During these transients, the difference between the power generated by the solar panel and the power put on the grid by the inverter (e.g., in the case of a solar array connected to the grid) is stored and released by an electrical energy storage device (e.g., an inverter input capacitor). Under certain conditions referred to as a string over-voltage, the power difference can cause the inverter input voltage to exceed the inverter's maximum rating, causing severe and permanent damage to the inverter.

SUMMARY

This disclosure provides a system and method for over-voltage protection of a photovoltaic system with distributed maximum power point tracking.

A solar panel array for use in a solar cell power system is provided. The solar panel array includes a string of solar panels and multiple voltage converters. Each of the voltage converters is coupled to a corresponding solar panel in the string of solar panels. Additionally, the solar panel array includes multiple maximum power point tracking (MPPT) controllers. Each of the MPPT controllers is coupled to a corresponding solar panel in the string of solar panels. Each of the MPPT controllers is configured to sense an instantaneous power unbalance between the corresponding solar panel and an inverter.

A device for use in a solar cell power system is also provided. The device includes a voltage converter adapted to be coupled to a solar panel in a string of solar panels. The device also includes an MPPT controller. The MPPT controller is coupled to the voltage converter. Additionally, the MPPT controller is configured to sense an instantaneous power unbalance between the solar panel and an inverter.

A method for over-voltage avoidance in a photovoltaic array is further provided. The method includes sensing at least one of multiple power variables. The method further includes detecting a power unbalance between a solar panel in a string of solar panels and an inverter coupled to a solar panel array. The method also includes regulating an output of a voltage converter.

Before undertaking the DETAILED DESCRIPTION below, it may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, firmware, software, or some combination of at least two of the same. The functionality associated with any particular controller may be centralized or distributed, whether locally or remotely.

BRIEF DESCRIPTION OF THE DRAWINGS

For a more complete understanding of this disclosure and its advantages, reference is now made to the following description, taken in conjunction with the accompanying drawings, in which like reference numerals represent like parts.

DETAILED DESCRIPTION

FIGS. 1 through 6, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged photovoltaic array system.

Figure 1:
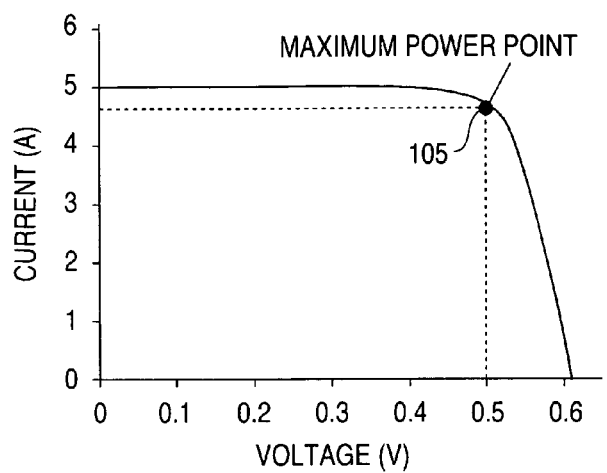
FIG. 1 illustrates an example I-V curve for a photovoltaic (PV) panel.
Figure 2:
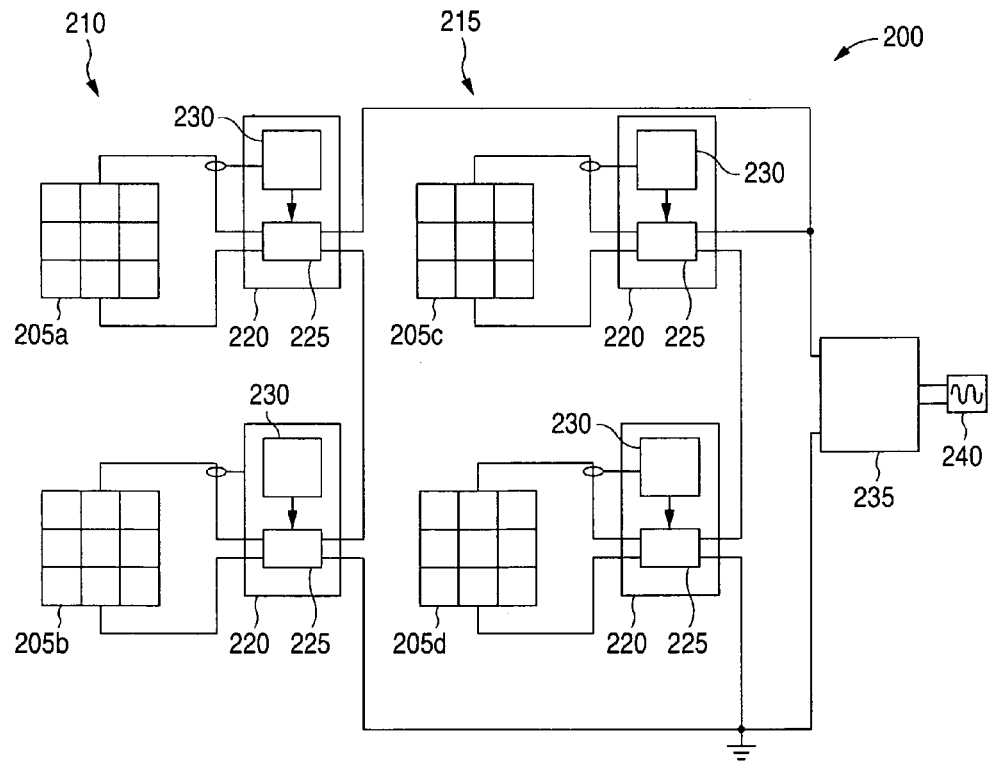
FIG. 2 illustrates an example PV array system according to embodiments of this disclosure.

FIG. 2 illustrates an example photovoltaic (PV) array system 200 according to embodiments of this disclosure. The embodiment of the PV array system 200 shown in FIG. 2 is for illustration only. Other embodiments of the PV array system 200 could be used without departing from the scope of this disclosure.

The PV array system 200 includes a number of solar panels 205a-205d (referred to collectively as solar panels 205). The solar panels 205 are arranged in series, in parallel, or both. For example, solar panel 205a can be coupled in series with solar panel 205b while solar panel 205c is coupled in series with solar panel 205d. Additionally, solar panels 205a and 205b are coupled in parallel with solar panels 205c and 205d. Solar panels 205 coupled in series (e.g., solar panels 205a and 205b) are referred to as strings. Therefore, as shown in FIG. 2, solar panels 205a and 205b form a first string 210, and solar panels 205c and 205d form a second string 215. Further, the voltage across the string 210 or 215 is referred to as the string voltage, and the current through the string 210 or 215 is referred to as the string current.

The PV array system 200 includes a DC-AC inverter 235. The PV array system 200 (e.g., solar array) is coupled to the DC-AC inverter 235. The solar panels 205 can be coupled in series with one or more additional solar panels 205 to the DC-AC inverter 235. Additionally, and alternatively, the solar panels 205 can be coupled in parallel with one or more additional solar panels 205 to the DC-AC inverter 235. The DC-AC inverter 235 extracts power from the PV array system 200 and converts the extracted power from DC to AC for interconnection with a power distribution grid ("grid") 240.

Each string 210, 215 of the PV array system 200 is sized according to a specified size for operation with the DC-AC inverter 235. The specified size is determined such that the sum of the open-circuit voltage of all the solar panels 205 in a string 210, 215 cannot exceed a maximum DC-AC inverter 235 input voltage rating corresponding to the temperature conditions specified by the PV array application.

Figure 3:
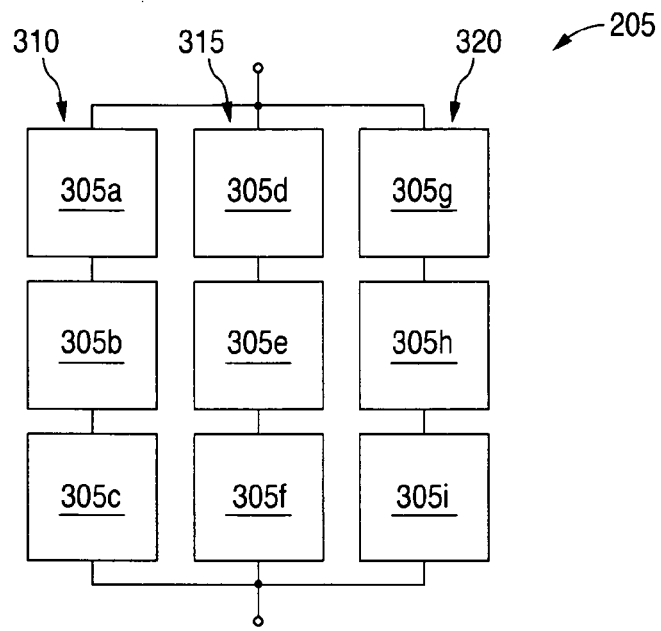
FIG. 3 illustrates an example solar panel according to embodiments of this disclosure.

FIG. 3 illustrates an example solar panel 205 according to embodiments of this disclosure. The embodiment of the solar panel 205 shown in FIG. 3 is for illustration only. Other embodiments of the solar panel 205 could be used without departing from the scope of this disclosure.

Each solar panel 205 includes a number of PV cells 305a-305i (referred to collectively as PV cells 305) arranged in series, in parallel, or both. For example, a first string 310 of PV cells is formed when PV cells 305a, 305b and 305c are coupled in series. A second string 315 of PV cells is formed when PV cells 305d, 305e and 305f are coupled in series. A third string 320 of PV cells is formed when PV cells 305g, 305h and 305i are coupled in series. Thereafter, the first string 310, second string 315 and third string 320 are coupled in parallel to form the solar panel 205.

The PV cells 305 are semiconductor devices that convert light directly into energy. When light shines on a PV cell, a voltage develops across the cell, and a current flows through the cell when connected to a load. The voltage and current vary with several factors, including the physical size of the cell, the amount of light shining on the cell, the temperature of the cell, and external factors. PV modules are coupled together such that each solar panel includes a positive potential (e.g., voltage).

Returning to FIG. 2, each solar panel 205 is coupled on its output terminals to a Panel Dedicated Converter (PDC) 220. The PDC 220 includes a DC-DC converter 225 coupled to the solar panel 205. Accordingly, the voltage across DC-DC converters 225 coupled in series is the string voltage, and the current through the DC-DC converters 225 coupled in series is the string current. The DC-DC converter 225 is configured to provide power conversion (e.g., bucking and boosting) for the solar panel 205. The DC-DC converter 225 converts the power to a voltage or current level which is more suitable to whatever load the system is designed to drive. For example, the DC-DC converter 225 performs two to one (2:1) boosting of the voltage received from the solar panel 205. In such example, the solar panel 205 is configured to output voltage in a range of thirty volts (30V) to fifty volts (50V) (e.g., output voltage may depend on amount of sunlight received at the solar panel 205). The DC-DC converter 225 boosts the voltage to a corresponding range of sixty volts (60V) to one hundred volts (100V) (e.g., when a high-voltage converter). In an additional example, the solar panel is configured to output voltage in a range of one volt (1V) to thirty volts (30V). The DC-DC converter 225 boosts the voltage to a corresponding range of two volts (2V) to sixty volts (60V) (e.g., when a low-voltage converter). It will be understood that although the examples illustrate a boosting operation, the DC-DC converter 225 can perform bucking operations as well.

The PDC 220 includes a Maximum Power Point Tracking (MPPT) controller 230 coupled to the DC-DC controller 225. The MPPT controller 230 is configured to sense the current from each solar panel 205. The MPPT controller 230 includes a central processing unit ("CPU"), a memory unit, an input/output ("I/O") device, one or more interfaces configured to couple to the DC-DC converter, and one or more sensory input terminals ("sensors") configured to measure current and voltage at the input and output of the DC-DC converter 225. The CPU, memory, I/O device, interfaces, and sensors are interconnected by one or more communication links (e.g., a bus). It is understood that the MPPT controller 230 may be differently configured and that each of the listed components may actually represent several different components. For example, the CPU may actually represent a multi-processor or a distributed processing system; the memory unit may include different levels of cache memory, main memory, hard disks, and remote storage locations; and the I/O device may include monitors, keyboards, and the like. Additionally, the memory unit stores a plurality of instructions configured to cause the CPU to perform one or more of the functions of the MPPT controller 230 outlined below. The memory unit also is capable of storing one or more sensed values for received via sensors and/or interfaces. Additionally, the memory unit is capable of storing threshold values.

PV cells have a single operating point (referred to as the maximum power point 105) where the values of the current (I) and voltage (V) of the cell result in a maximum power output. A PV cell (and corresponding PV module 305) has an exponential relationship between current and voltage, and the maximum power point (MPP) 105 occurs at the knee of the curve where the resistance is equal to the negative of the differential resistance ($V/I = -\Delta V/\Delta I$). The MPPT controller 230 searches for the maximum power point 105. Then, the MPPT controller 230 varies the duty cycle of the DC-DC converter 225. Therefore, the MPPT controller 230 enables the DC-DC converter 225 to extract the maximum power available from the PV module 305.

Therefore, the PDC 220 is a high efficiency DC-to-DC converter that functions as an optimal electrical load for a solar panel 205 (or PV array system 200 when coupled to the entire array) and converts the power to a voltage or current level which is more suitable to whatever load the system is designed to drive. The PDC 220 is capable of performing per panel maximum power point tracking.

A solar panel 205 operated at the MPP can be modeled at steady-state as an ideal power source as described, using generator convention, by Equation 1:

$$V_{pan}(t) * I_{pan}(t) = P_{MPP}. \quad [\text{Eqn. 1}]$$

In Equation 1, $V_{pan}(t)$ is the voltage of the solar panel 205, $I_{pan}(t)$ is the current of the solar panel 205, and $P_{MPP}$ is the power generated by the solar panel 205 at MPP.

A grid-tied DC-AC inverter 235 can be modeled at steady-state as an ideal power sink, described using load convention by Equation 2:

$$V_{string}(t) * I_{string}(t) = P_{string}. \quad [\text{Eqn. 2}]$$

In Equation 2, $V_{string}(t)$ is the input voltage of the DC-AC inverter 235, $I_{string}(t)$ is the input current of the DC-AC inverter 235, and $P_{string}$ is the total input power.

The total power generated by the PV array system 200 is the input power of the DC-AC inverter 235. At steady-state, the input power generated by the PV array system 200 equals the power put in the distribution grid 240 by the DC-AC inverter 235. Steady-state neat power balance is achieved by an active controller (not shown) integrated in the DC-AC inverter 235. To assist in achieving instantaneous power balance during transients, the DC-AC inverter 235 also includes an energy storage component (not shown). The energy storage component can be, but is not limited to, a capacitor connected at the input terminals of the DC-AC inverter 235.

The PV array system 200 is capable of large and fast power transients. During these transients, a difference between the power generated by the PV array system 200 and the power output to the grid 240 by the DC-AC inverter 235 is stored and released by the inverter capacitor. String over-voltage can occur when the power difference causes the input voltage of the DC-AC inverter 235 to exceed the maximum rating of the DC-AC inverter 235. Additionally, string over-voltage can occur as a result of a sudden AC-side disconnect at the DC-AC inverter 235 while operating under MPPT. In such condition, since PDC 220 performs real-time MPPT of the solar panel 205 to which the PDC 220 is connected, the power generated by the PV array system 200 can be considered constant, while the power output on the grid 240 by the DC-AC inverter 235 drops suddenly to zero. Accordingly, the entire power from the PV array system 200 is transferred to the inverter input capacitor as defined by Equations 3 and 4:

$$V_{string}(t) * I_{string}(t) = P_{array} \quad [\text{Eqn. 3}]$$

$$I_{string}(t) = C \frac{dV_{string}(t)}{dt}. \quad [\text{Eqn. 4}]$$

In Equations 3 and 4, C is the capacitance of the inverter input capacitor, and $P_{array}$ is the total power generated by the PV array system 200.

Equations 3 and 4 can be rewritten as Equation 5:

$$V_{string}(t) = \sqrt{\frac{2tP_{array}}{C}}. \quad [\text{Eqn. 5}]$$

Equation 5 illustrates that the string voltage will grow indefinitely. In order to avoid string over-voltage, the MPPT controller 230 senses instantaneous power unbalance between the PV array system 200 and the DC-AC inverter 235. The MPPT controller 230 senses multiple power variables. The power variables include, but are not limited to, input voltage, input current, output voltage, and output current. The MPPT controller 230 can sense input current and input voltage (i.e., current and voltage at the input terminals of the DC-DC converter 225) and output current and output voltage (i.e., current and voltage at the output terminals of the DC-DC converter 225). In some embodiments, the MPPT controller 230 estimates one or more variables based on a sensed variable. For example, the MPPT controller 230 can estimate output current and output voltage based on sensed values for input voltage, input current and the corresponding duty cycle of the DC-DC converter 225. Additionally, the MPPT controller 230 measures the slopes of the sensed and estimated variables.

As an example, in the event that an AC disconnect event occurs at a time $t=0$, assuming $V_{string}(0) = V_{steady-state}$, and $I_{string}(0)$ is defined by Equation 6:

$$I_{string}(0) = \frac{P_{array}}{V_{steady-state}} = I_{steady-state} \quad [\text{Eqn. 6}]$$

then the slope of the output voltage of a single solar panel's DC-DC converter 225 at the time $t=0$ is defined by Equation 7:

$$\left. \frac{dV_{out}(t)}{dt} \right|_{t=0} = \frac{I_{steady-state}}{\frac{C}{N}} \quad [\text{Eqn. 7}]$$

In Equation 7, N is the number of solar panels 205 in the string 210, and $V_{out}$ is the output voltage of a single PDC 220.

Figure 4:
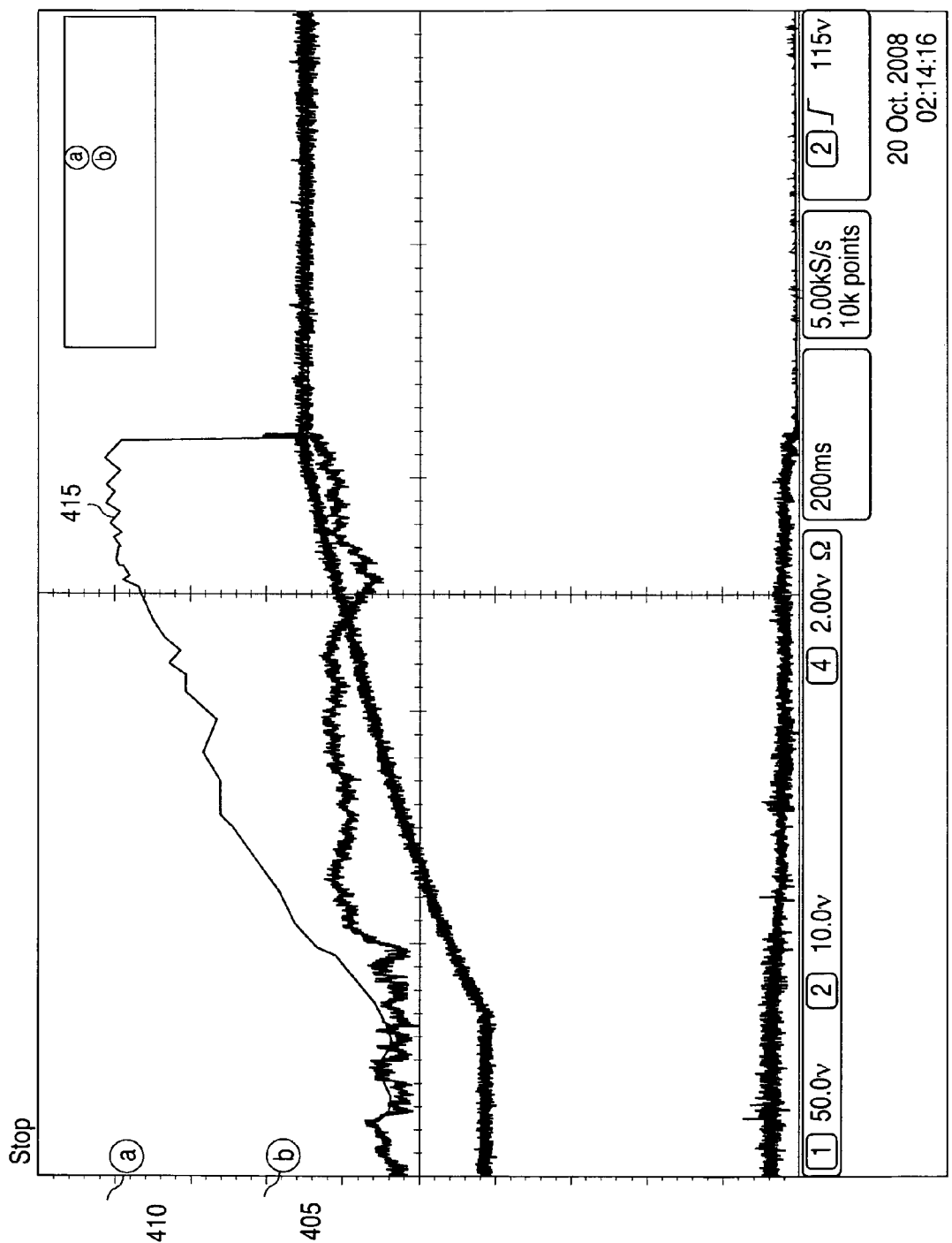
FIG. 4 illustrates an example AC disconnection event according to embodiments of this disclosure.

FIG. 4 illustrates an example AC disconnection event according to embodiments of this disclosure. The embodiment of the AC disconnection event shown in FIG. 4 is for illustration only. Other embodiments of the AC disconnection event could be used without departing from the scope of this disclosure.

FIG. 4 illustrates that the output voltage of the PDC 220 rises well above the open circuit voltage of the solar panel 205 (sixty-five volts 405 in this example), reaching a voltage of eighty-five volts 410. This can easily cause the string voltage to exceed the maximum input voltage of the inverter 235.

Therefore, for a given number of solar panels 205 in a string and for a given value of C, the MPPT controller 230 can detect the AC disconnect event by measuring the slope of the output voltage 415 as long as the current $I_{steady\text{-}state}$ is high enough. The MPPT controller 230 compares the slope of the output voltage 415 to a pre-set threshold that is chosen according to system parameters to not affect normal operation. Additionally and alternatively, the MPPT controller 230 can detect the AC disconnection event by measuring the number of duty-cycle up-steps within a certain time window.

Once the MPPT controller 230 detects the AC disconnection event, the MPPT controller 230 reduces or avoids string over-voltage by reducing the duty cycle of the DC-DC converter 225. By doing this, the MPPT controller 230 moves the operating point of the PDC 220 away from the maximum power point 105 and causes the output power of the panel to decrease and, eventually, to drop to "0." The MPPT controller 230 can vary the conversion ratio of the DC-DC converter 225 by forcing the duty cycle to be a specific value, limiting the duty cycle of the DC-DC converter 225, varying the duty cycle of the DC-DC converter 225 by an amount proportional to the output voltage or the output voltage slew rate, setting the output of the DC-DC converter 225 to a maximum output voltage, or any combination of the above.

As an example, the MPPT controller 230 can set the conversation ratio of the DC-DC converter 225 to a specific value, such as, but not limited to, one (e.g., 1:1). Therefore, the MPPT controller 230 forces the DC-DC converter 225 not to boost the voltage from the solar panel 205. In this condition, when the solar panel 205 is configured to output a voltage in the range of 30V-50V, the DC-DC converter 225 outputs a corresponding voltage in the range of 30V-50V. Additionally, when the solar panel 205 is configured to output a voltage in the range of 1V-30V, the DC-DC converter 225 outputs a corresponding voltage in the range of 1V-30V.

Additionally and alternatively, the MPPT controller 230 can vary the duty-cycle of the DC-DC converter 225 by an amount proportional to the output voltage or the output voltage slew rate. Given a certain voltage slew-rate threshold, the MPPT controller 230 regulates the duty-cycle of the DC-DC converter 225 to operate the system at a current that corresponds to an initial output voltage slew-rate lower than the voltage slew-rate threshold. Additionally, to avoid the risk of operating in such condition, the MPPT controller 230 utilizes a minimum power current $I_{string\_min}$ to detect the AC disconnection event. $I_{string\_min}$ is determined using Equation 7, where the current is the output current of the PDC 220, which is the same for every PDC 220 in the string 210. Further, in order to avoid a non-detectable AC disconnection event resulting from when the output current of the PDC 220 is below $I_{string\_min}$, the MPPT controller 230 limits the conversion ratio of the DC-DC converter 225. When the output current of the PDC 220 is below $I_{string\_min}$, the MPPT controller 230 limits the conversion ratio to one (e.g., 1:1). Therefore, in the event that an AC disconnection event occurs that cannot be detected, the MPPT controller 230 causes the maximum string voltage to not exceed the sum of the open-circuit voltages of the solar panels 205 in the string 210 and, consequently, the maximum input voltage of the DC-AC inverter 235. The technique described above could also be implemented by setting a proper minimum value of input current of the PDC 220 and implementing a similar process. For example, output or input current could be used.

Furthermore, the MPPT controller 230 can limit the output voltage of the DC-DC converter 225 to a maximum value. For example, the voltage of the DC-DC converter 225 can be limited to a maximum of 100V when coupled to a solar panel 205 configured to output a voltage in the range of 30V-50V. Additionally and alternatively, the voltage of the DC-DC converter 225 can be limited to a maximum of 50V when coupled to a solar panel 205 configured to output a voltage in the range of 1V-30V.

Accordingly, since the MPPT controller 230 is coupled to an individual solar panel 205 as part of the PDC 220, the MPPT 230 does not sense the voltage of the string 210. However, the MPPT controller 230 is able to regulate the input voltage to the DC-AC inverter 235 by sensing one or more variables related to the solar panel 205.

Figure 5:
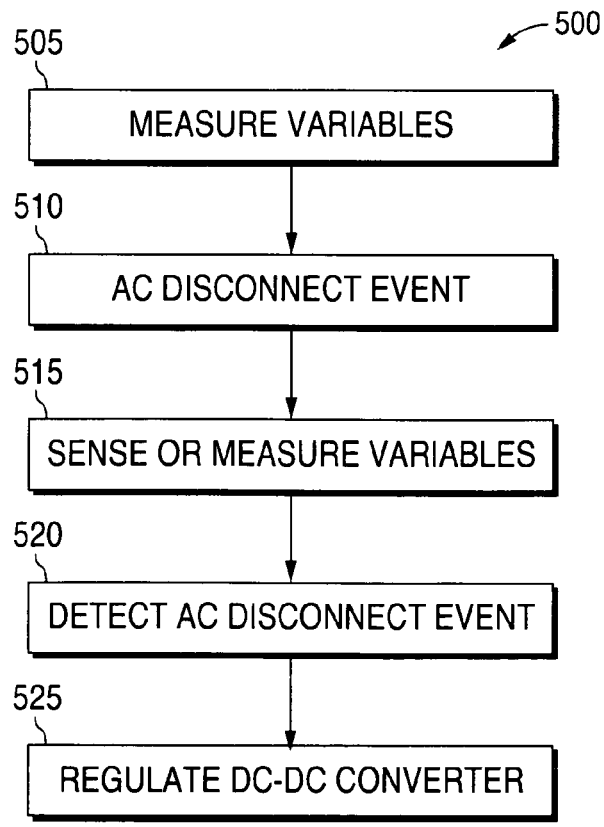
FIG. 5 illustrates an example over-voltage protection process in a PV array according to embodiments of this disclosure.

FIG. 5 illustrates an example over-voltage protection process 500 in a PV array according to embodiments of this disclosure. The embodiment of the over-voltage protection process 500 shown in FIG. 5 is for illustration only. Other embodiments of the over-voltage protection process 500 could be used without departing from the scope of this disclosure.

An MPPT controller measures one or more power variables of a solar panel in a string of solar panels in step 505. The power variables include the DC-DC converter input current, input voltage, output current and/or output voltage. In some embodiments, the MPPT controller 230 stores the measured power variable(s) and the duty cycle of the DC-DC converter 225 in the memory unit.

In step 510, an AC disconnection event occurs. As a result of the AC disconnection event, a power unbalance occurs between an inverter 235 and the solar panel 205. As a result of the AC disconnection event, the power generated by the PV array is substantially constant, while the power output onto the grid 240 by the DC-AC inverter 235 drops suddenly to zero. In some embodiments, an AC disconnection event does not occur, however, a power difference between the inverter and PV array occurs.

The MPPT controller senses at least one power variable in step 515. Using the sensed power variable and the duty cycle, for example, the MPPT controller estimates one or more additional power variables in step 515. Therefore, the MPPT controller 230 detects the AC-disconnection event by measuring the slope of the output voltage of the DC-DC converter in step 520.

The MPPT controller regulates the output voltage of the DC-DC converter in step 525. In some embodiments, the MPPT controller 230 reduces the duty cycle of the DC-DC converter 225. For example, the MPPT controller 230 can set the conversion ratio to be a specific value. Additionally and alternatively, the MPPT controller 230 can limit the duty cycle or vary the duty cycle by an amount proportional to the output voltage or output voltage slew rate. In some embodiments, the MPPT controller 230 sets the output voltage of the DC-DC converter 225 to a maximum value.

Figure 6:
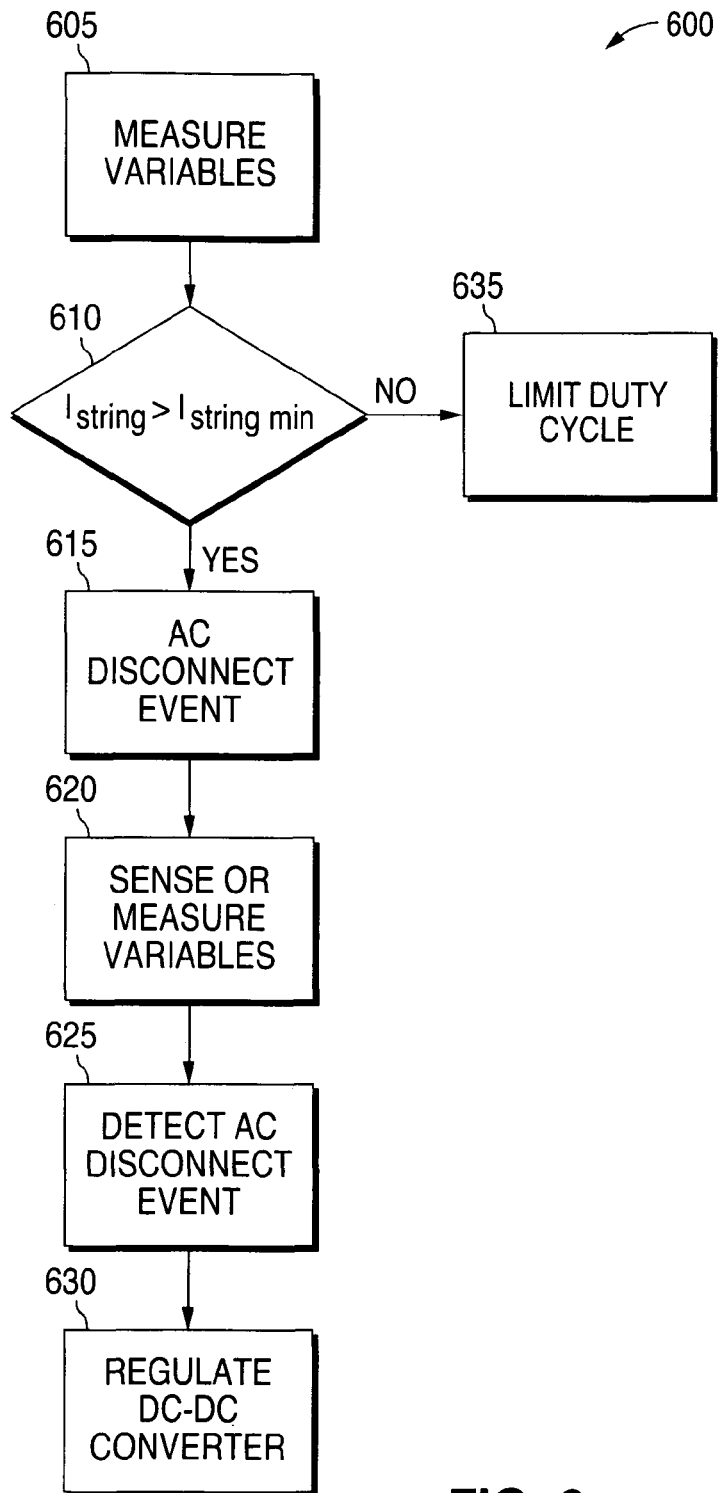
FIG. 6 illustrates an example over-voltage protection process in a PV array when an AC disconnection event is not detected according to embodiments of this disclosure.

FIG. 6 illustrates an example over-voltage protection process 600 in a PV array when an AC disconnection event is not detected according to embodiments of this disclosure. The embodiment of the over-voltage protection process 600 shown in FIG. 6 is for illustration only. Other embodiments of the over-voltage protection process 600 could be used without departing from the scope of this disclosure. In FIG. 6, an over-voltage protection process 600 includes the case in which the AC disconnection event cannot be detected due to the fact that the string current is not high enough.

An MPPT controller measures one or more power variables of a solar panel in a string of solar panels in step 605. The power variables include the DC-DC converter input current, input voltage, output current and/or output voltage. In some embodiments, the MPPT controller 230 stores the measured power variable(s) and the duty cycle of the DC-DC converter 225 in the memory unit.

In some embodiments, the MPPT controller uses a minimum output current threshold in the process of detecting an AC disconnection event. The AC disconnection event may not be detectable due to the fact that the string current is not high enough. For example, in step 615, a minimum power current threshold $I_{string\_min}$ is used to determine if an AC disconnect event is detected. If the output current $I_{string}$ is less than $I_{string\_min}$ ($I_{string} < I_{string\_min}$), an AC disconnection event is not detected. Therefore, the MPPT controller limits the duty cycle of the DC-DC converter in step 635. Accordingly, the converter 225 is not allowed to boost as much. The MPPT controller 230 causes the maximum string voltage to not exceed the sum of the open-circuit voltages of the solar panels 205 in the string and, consequently, the maximum input voltage of the DC-AC inverter 235.

If the output current $I_{string}$ is greater than $I_{string\_min}$ ($I_{string} > I_{string\_min}$), the process moves to step 615. In step 615, an AC disconnection event occurs. As a result of the AC disconnection event, a power unbalance occurs between an inverter 235 and a solar panel 205. As a result of the AC disconnection event, the power generated by the PV array is substantially constant, while the power output onto the grid 240 by the DC-AC inverter 235 drops suddenly to zero.

The MPPT controller senses at least one power variable in step 620. Using the sensed power variable and the duty cycle, for example, the MPPT controller can estimate one or more additional power variables in step 620. The MPPT controller detects the AC-disconnection event by measuring the slope of the output voltage of the DC-DC converter in step 625.

The MPPT controller regulates the output voltage of the DC-DC converter in step 630. In some embodiments, the MPPT controller 230 reduces the duty cycle of the DC-DC converter 225. For example, the MPPT controller 230 can set the conversion ratio to be a specific value. Additionally and alternatively, the MPPT controller 230 can limit the duty cycle or vary the duty cycle by an amount proportional to the output voltage or output voltage slew rate. In some embodiments, the MPPT controller 230 sets the output voltage of the DC-DC converter 225 to a maximum value.

Although this disclosure has described various example embodiments, various changes and modifications may be suggested to one skilled in the art. It is intended that this disclosure encompass such changes and modifications as fall within the scope of the appended claims.

What is claimed is:

1. A solar panel array for use in a solar cell power system, the solar panel array comprising:
    a string of solar panels coupled in series;
    an inverter configured to couple power from the string of solar panels to a load, the inverter including an energy storage element;
    multiple voltage converters, each voltage converter coupled to a corresponding solar panel in the string of solar panels and configured to convert power output from the solar panel to the string; and
    multiple maximum power point tracking (MPPT) controllers, each MPPT controller coupled to a corresponding voltage converter and configured to control power output from the voltage converter to the string;
    each MPPT controller configured to
        detect, at the solar panel, an instantaneous power unbalance between the corresponding solar panel and the energy storage element caused by limiting power output from the inverter to the load based on a rate of change of at least one power variable derived from the solar panel exceeding a predetermine maximum value, and without detecting a voltage on the energy storage element; and
        adjust power output from the voltage converter to the string in response to the detected instantaneous power unbalance.

2. The solar panel array of claim 1, wherein the power unbalance is detected by at least one of: (a) sensing power variables; and (b) estimating power variables.

3. The solar panel array of claim 1 wherein the power unbalance is caused by interrupting power output from the inverter to the load.

4. The solar panel array of claim 3, wherein the energy storage element is a capacitor, and wherein detecting the power unbalance is based on determining substantially at the time the power interruption occurs the slope of an output voltage $V_{OUT}$ of the corresponding voltage converter according to:

$$dV_{OUT}/dt = I_{STRING}/C/N$$

where $I_{STRING}$ is the current output from the corresponding voltage converter, C is the capacitance of the capacitor and N is the number of solar panels in the string.

5. The solar panel array of claim 1, wherein detecting the power unbalance is based on determining a predetermined number of duty-cycle up-steps within a time window.

6. The solar panel array of claim 1, wherein, after detecting the power unbalance, the MPPT controller is configured to limit a power output of the corresponding solar panel by at least one of: (a) limiting a duty cycle of the corresponding voltage converter to a specified value; (b) limiting such duty cycle by an amount proportional to the output voltage; and (c) setting the power output of the voltage converter to a predetermined maximum output value.

7. The solar panel array of claim 1, wherein each MPPT controller detects when an output current from the corresponding voltage converter is below a predetermined minimum value, and in response limits the conversion ratio of such voltage converter to a predetermined ratio such that the sum of output voltages from the solar panels of the string is less than a predetermined maximum string voltage.

8. A device for use in a solar cell power system that includes a string of solar panels coupled in series and an inverter configured to couple power from the string of solar panels to a load, the inverter including an energy storage element, the device comprising:
    a voltage converter adapted to be coupled to a solar panel in the string of solar panels and configured to convert power output from the solar panel to the string; and
    a maximum power point tracking (MPPT) controller coupled to the voltage converter, the MPPT controller configured to control power output from the voltage controller to the string and to
        detect, at the solar panel, an instantaneous power unbalance between the corresponding solar panel and the energy storage element caused by limiting power output from the inverter to the load based on a rate of change of at least one power variable derived from the solar panel exceeding a predetermine maximum value, and without detecting a voltage on the energy storage element; and adjust power output from the voltage converter to the string in response to the detected instantaneous power unbalance.

9. The device of claim 8, wherein the power unbalance is detected by at least one of: (a) sensing power variables; and (b) estimating power variables.

10. The device of claim 8, wherein the power unbalance is caused by interrupting power output from the inverter to the load.

11. The device of claim 10, wherein the energy storage element is a capacitor, and wherein detecting the power unbalance is based on determining substantially at the time the power interruption occurs the slope of an output voltage $V_{OUT}$ of the voltage converter according to:

$$dV_{OUT}/dt = I_{STRING}/C/N$$

where $I_{STRING}$ is the current output from the corresponding voltage converter, C is the capacitance of the capacitor and N is the number of solar panels in the string.

12. The device of claim 8, wherein detecting the power unbalance is based on determining a predetermined number of duty-cycle up-steps within a time window.

13. The device of claim 8, wherein, after detecting the power unbalance, the MPPT controller is configured to limit a power output of the solar panel by at least one of: (a) limiting a duty cycle of the voltage converter to a specified value; (b) limiting such duty cycle by an amount proportional to the output voltage; and (c) setting the power output of the voltage converter to a predetermined maximum output value.

14. The device of claim 8, wherein each MPPT controller detects when an output current from the voltage converter is below a predetermined minimum value, and in response limits the conversion ratio of the voltage converter to a predetermined ratio such that the sum of output voltages from the solar panels of the string is less than a predetermined maximum string voltage.

15. A method for over-voltage avoidance in a photovoltaic array that includes a string of series-coupled solar panels, and an inverter configured to couple power from the string of solar panels to a load, the inverter including an energy storage element, the method comprising:

controlling the power output from at least one solar panel to the string of series-coupled solar panels in accordance with maximum power point tracking (MPPT);

detecting, at the solar panel, an instantaneous power unbalance between a solar panel in the string of solar panels and the energy storage element caused by limiting power output from the inverter to the load based on a rate of change of at least one power variable derived from the solar panel exceeding a predetermine maximum value, and without detecting a voltage on the energy storage element; and adjusting power output from the solar panel to the string in response to the detected power unbalance.

16. The method of claim 15, wherein the power unbalance is detected by at least one of: (a) sensing power variables; and (b) estimating power variables.

17. The method of claim 15 wherein the power unbalance is caused by interrupting power output from the inverter to the load.

18. The method of claim 15, wherein the energy storage element is a capacitor, and wherein detecting the power unbalance is based on determining substantially at the time the power interruption occurs the slope of an output voltage $V_{OUT}$ corresponding to the power output of the solar panel according to:

$$dV_{OUT}/dt = I_{STRING}/C/N$$

where $I_{STRING}$ is the current output corresponding to the power output of the solar panel, C is the capacitance of the capacitor and N is the number of solar panels in the string.

19. The method of claim 15, wherein:

power output from the solar panel to the string is performed by a voltage converter controlled in accordance with maximum power point tracking (MPPT); and after detecting the power unbalance, adjusting the power output from the solar panel to the string is accomplished by at least one of: (a) limiting a duty cycle of the voltage converter to a specified value; (b) limiting such duty cycle by an amount proportional to the output voltage; and (c) setting the power output of the voltage converter to a predetermined maximum output value.

20. The method of claim 15, wherein an output current corresponding to the power output from the solar panel to the string is below a predetermined minimum value, and in response the conversion ratio corresponding to the power output of the solar panel to the string is limited to a predetermined ratio such that the sum of output voltages from the solar panels of the string is less than a predetermined maximum string voltage.

\* \* \* \* \*